(12) United States Patent
Shin et al.

(10) Patent No.: US 7,099,530 B2
(45) Date of Patent: Aug. 29, 2006

(54) OPTICAL TRANSMITTER MODULE AND WAVELENGTH DIVISION MULTIPLEXING LIGHT SOURCE USING THE SAME

(75) Inventors: Dong-Jae Shin, Suwon-si (KR); Jung-Kee Lee, Suwon-si (KR); Jeong-Seok Lee, Anyang-si (KR); Seong-Taek Hwang, Pyeongtaek-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 71 days.

(21) Appl. No.: 10/841,051

(22) Filed: May 7, 2004

(65) Prior Publication Data
US 2005/0089270 A1   Apr. 28, 2005

(30) Foreign Application Priority Data
Oct. 27, 2003   (KR) ................ 10-2003-0075176

(51) Int. Cl.
*G02B 6/26* (2006.01)
(52) U.S. Cl. .............. 385/27; 398/68; 359/237; 359/333; 359/342; 385/131
(58) Field of Classification Search ............. 385/14, 385/129–132, 27; 398/68; 359/237, 333, 359/347
See application file for complete search history.

(56) References Cited
U.S. PATENT DOCUMENTS

| | | |
|---|---|---|
| 2001/0004290 A1* | 6/2001 | Lee et al. ............. 359/124 |
| 2004/0033004 A1* | 2/2004 | Welch et al. .......... 385/14 |
| 2005/0111848 A1* | 5/2005 | Grubb et al. .......... 398/147 |

* cited by examiner

Primary Examiner—Michelle Connelly-Cushwa
Assistant Examiner—James D. Stein
(74) Attorney, Agent, or Firm—Cha & Reiter, L.L.C.

(57) ABSTRACT

An optical transmitter module for creating an optical signal having the same wavelength as an incoherent light inputted thereinto is provided. The module includes a substrate, a multi-layer crystal growth layer including a first area for amplifying the incoherent light and the optical signal and a second area for creating an optical signal having the same wavelength as the incoherent light amplified by means of the first area, and an electrode unit for independently injecting currents into the areas of the multi-layer crystal growth layer. A light generated at a broadband light source is spectrum-sliced and injected into the optical transmitter module so that a wavelength division multiplexing light source is realised.

4 Claims, 2 Drawing Sheets

OPTICAL TRANSMITTER MODULE AND WAVELENGTH DIVISION MULTIPLEXING LIGHT SOURCE USING THE SAME

CLAIM OF PRIORITY

This application claims priority to an application entitled "OPTICAL TRANSMITTER MODULE AND WAVELENGTH DIVISION MULTIPLEXING LIGHT SOURCE USING THE SAME," filed in the Korean Intellectual Property Office on Oct. 27, 2003 and assigned Serial No. 2003-75176, the contents of which are hereby incorporated by reference.

BACKGROUND OF THE INVENTION

1. Field of the Invention

The present invention relates to a light source used for an optical communication, and more particularly to a wavelength division multiplexing light source applicable to an optical communication system.

2. Description of the Related Art

A wavelength division multiplexing passive optical network involves multiplexing of a plurality of optical signals having different wavelengths so that the multiplexed optical signals can be transmitted/received on a single optical fiber. The wavelength division multiplexing passive optical network comprises a central office for detecting upstream optical signals received from a plurality of subscribers so that communication services are provided to the subscribers, respectively, and remote nodes disposed between the central office and the respective subscribers for connecting the central office and the respective subscribers.

The central office modulates data to be provided to the respective subscribers in the form of optical signals and then outputs the modulated data. The central office creates downstream optical signals having different wavelengths for a subsequent transmission to respective subscribers. In this regard, the central office includes an optical source for creating the downstream optical signals.

A distributed feedback laser array, a multi-frequency laser, a spectrum-sliced light source, and an injection-locked Fabry-Perot laser with incoherent light may be used for creating the downstream optical signals. Further, a reflective semiconductor optical amplifier may be used for amplifying and modulating incoherent light inputted from the outside. The wavelength division multiplexing light source comprises a light source for outputting a broadband light, an optical element for dividing the light outputted from the light source into optical signals having different wavelengths, and external modulators for modulating the optical signals.

A light emitting diode, a super-luminescent diode, a Fabry-Perot laser, an optical fiber amplifier, and a ultra-short pulse laser may be used as light source. The light emitting diode and the super-luminescent diode have wide bandwidths and relatively inexpensive, and the Fabry-Perot laser provides high output at a nominal cost. As the optical element for spectrum-slicing the broadband light into optical signals having different wavelengths, an optical filter or a waveguide grating router (WGR) may be used. The external modulators are used for modulating and outputting the optical signals sliced from the optical element. $LiNbO_3$ may be used as external modulator.

In the case of the super-luminescent diode and the light emitting diode, however, the bandwidths and outputs that can be modulated are low even though their output light bandwidths are wide. As a result, the super-luminescent diode or the light emitting diode is not a suitable choice as a light source for creating downstream optical signals outputted to the respective subscribers. Also, the Fabry-Perot laser has a narrow bandwidth. As a result, the Fabry-Perot laser is not also suitable as a wavelength division multiplexing light source requiring a broadband light. Furthermore, the Fabry-Perot laser has a drawback in that mode partition noise is generated between the optical signals since the Fabry-Perot laser modulates spectrum-sliced optical signals at a high speed and outputs the modulated optical signals, thus degrading the performance.

An injection-locked light source comprises a broadband light source for creating a broadband light with incoherent lights having different wavelengths, which are necessary to induce an injection-locked phenomenon, a demultiplexing element for demultiplexing the broadband light into the respective incoherent lights, and Fabry-Perot lasers for creating injection-locked downstream optical signals with the incoherent lights.

The Fabry-Perot laser creates injection-locked optical signals, which are obtained by directly modulating the incoherent lights. As such, no additional external modulator is required, and the wavelengths of the injection-locked optical signals can be controlled by changing the wavelengths of the incoherent lights. Thus, a plurality of optical signals having different wavelengths can be created by means of Fabry-Perot lasers of one kind by inputting incoherent lights having different wavelengths to the Fabry-Perot lasers, respectively.

Moreover, a reflective semiconductor optical amplifier has operational characteristics similar to those of the injection-locked light source. In particular, a broadband light created at the broadband light source is demultiplexed into incoherent lights, and then the corresponding demultiplexed incoherent light is modulated and amplified.

With the injection-locked Fabry-Perot laser, however, an injection-locked phenomenon is generated only when the intensity of the inputted incoherent light exceeds a prescribed intensity value. Consequently, incoherent light having a high-output intensity is required. The transmission property of the reflective semiconductor optical amplifier is improved by means of gain saturation generated when the intensity of incoherent light inputted thereinto is large. Consequently, a high-output broadband light source is required. Therefore, there is a need for an improved optical transmitter at a low cost.

SUMMARY OF THE INVENTION

The present invention provides an optical transmitter module applicable to a wavelength division multiplexing light source and capable of creating an injection-locked optical signal with a low-intensity incoherent light and creating an amplified and modulated optical signal.

In accordance with the present invention, t an optical transmitter module for creating an optical signal having the same wavelength as an incoherent light inputted thereinto is provided and includes: a substrate; a multi-layer crystal growth layer including a first area for amplifying the incoherent light and the optical signal and a second area for creating an optical signal having the same wavelength as the incoherent light amplified by means of the first area; and an electrode unit for independently injecting currents into the areas of the multi-layer crystal growth layer.

BRIEF DESCRIPTION OF THE DRAWINGS

The above features and other advantages of the present invention will be more clearly understood from the following detailed description taken in conjunction with the accompanying drawings, in which.

DETAILED DESCRIPTION OF THE INVENTION

Now, embodiments of the present invention will be described in detail with reference to the annexed drawings. For the purposes of clarity and simplicity, a detailed description of known functions and configurations incorporated herein will be omitted as it may make the subject matter of the present invention unclear.

Figure 1:
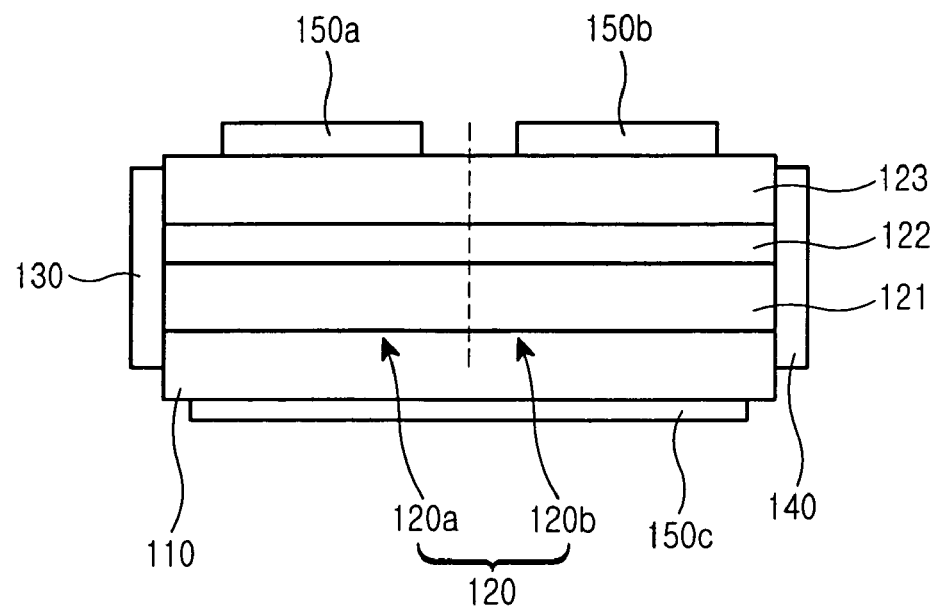
FIG. 1 is a diagram showing the construction of an optical transmitter module according to a first embodiment of the present invention.

FIG. 1 is a diagram showing the construction of an optical transmitter module according to a first embodiment of the present invention. As shown, the optical transmitter module according to the present invention includes: a substrate 110; a multi-layer crystal growth layer 120 divided into a first area 120a and a second area 120b; an electrode unit 150a, 150b, and 150c; an anti-reflection layer 130 coated at one end of the optical module including the first area 120a; and a reflection layer 140 coated at the other end of the optical module including the second area 120b.

On the upper surface of the substrate 110 is formed with the multi-layer crystal growth layer 120, and on the lower surface of the substrate 110 is formed with the common electrode 150c.

The multi-layer crystal growth layer 120 includes: a lower clad 121 formed on the substrate 110; an active layer 122 formed on the lower clad 121; and an upper clad 123 formed on the active layer 122.

The multi-layer crystal growth layer 120 is divided into the first area 120a for amplifying an incoherent light inputted thereinto and an optical signal received therein, and the second area 120b for amplifying the incoherent light amplified by means of the first area 120a to obtain an amplified optical signal and outputting the amplified optical signal to the first area 120a. To the first and second areas 120a and 120b are independently applied currents by means of the independent electrodes 150a, 150b, and 150c, respectively.

The first area 120a amplifies the incoherent light inputted into the anti-reflection layer 130 and then outputs the amplified incoherent light to the second area 120b. The second area 120b modulates the incoherent light inputted from the first area 120a to obtain an optical signal carrying data, amplifies the modulated optical signal, and outputs the amplified optical signal to the first area 120a.

The electrode unit 150a, 150b, and 150c serves to independently inject currents into the first and second areas 120a and 120b of the multi-layer crystal growth layer 120. On the upper surface of the multi-layer crystal growth layer 120 corresponding to the first and second areas 120a and 120b are formed with first and second electrodes 150a and 150b, which are spaced apart from each other by a prescribed distance.

A direct current is applied to the first electrode 150a. The first area 120a is driven as a semiconductor optical amplifier by means of the direct current applied to the first electrode 150a.

A direct or alternating current is applied to the second electrode 150b. The second area 120b performs the same function as a reflective semiconductor optical amplifier for modulating the incoherent light inputted thereinto into an optical signal by means of the current applied to the second electrode 150b.

Figure 2:
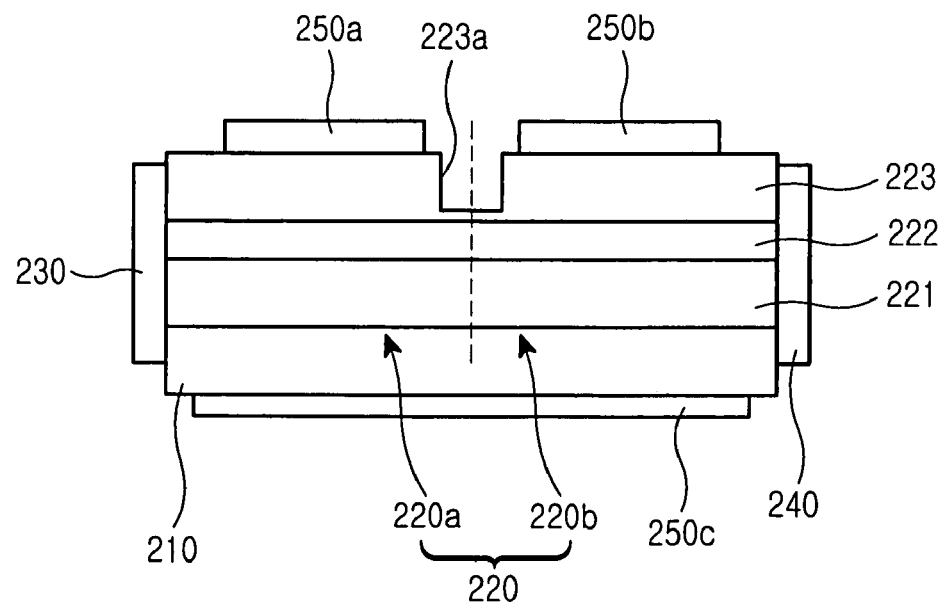
FIG. 2 is a diagram showing the construction of an optical transmitter module according to a second embodiment of the present invention.

FIG. 2 is a diagram showing the construction of an optical transmitter module according to a second embodiment of the present invention. As shown, the optical transmitter module according to the present invention includes: a substrate 210; a multi-layer crystal growth layer 220; an electrode unit 250a, 250b, and 250c; an anti-reflection layer 230; and a reflection layer 240, whereby an injection-locked optical signal with high intensity is created from an incoherent light, with low intensity, inputted into the optical transmitter module.

The multi-layer crystal growth layer 220 includes: a lower clad 221 formed on the substrate 210; an active layer 222 formed on the lower clad 221; and an upper clad 223 formed on the active layer 222. The multi-layer crystal growth layer 220 is divided into first and second areas 220a and 220b. A groove 223a having a prescribed width is formed between the first and second areas 220a and 220b is formed.

The groove 223a is formed with prescribed width and depth between the first and second area 220a and 220b on the upper clad 223. The groove 223a increases insulation resistance between the first and second areas 220a and 220b so that electric crosstalk is decreased.

The first area 220a amplifies an incoherent light inputted thereinto and outputs the amplified incoherent light to the second area 220b. The first area 220a also amplifies an optical signal inputted from the second area 220b and outputs the amplified optical signal to the anti-reflection layer 230.

The second area 220b creates an injection-locked optical signal with the incoherent light. The second area 220b is disposed between the groove 223a and the reflection layer 240, which are spaced apart from each other by a prescribed distance. Consequently, the second area 220b, together with the groove 223a and the reflection layer 240 has the same operational characteristics as a Fabry-Perot laser for creating an injection-locked optical light with the incoherent light inputted from the first area 220a. This injection-locked optical signal with the incoherent light inputted is output back to the first area 220a.

The anti-reflection layer 230 is coated at one end of the optical module including the first area 220a. The reflection layer 240 is coated at the other end of the optical module including the second area 220b.

The electrode unit 250a, 250b, and 250c serves to independently inject currents into the first and second areas 220a and 220b of the multi-layer crystal growth layer 220. A common electrode 250c is formed on the lower surface of the substrate 210, and first and second electrodes 250a and 250b are formed on the upper surface of the multi-layer crystal growth layer 220 corresponding to the first and second areas 220a and 220b while being spaced apart from each other by a prescribed distance.

Figure 3:
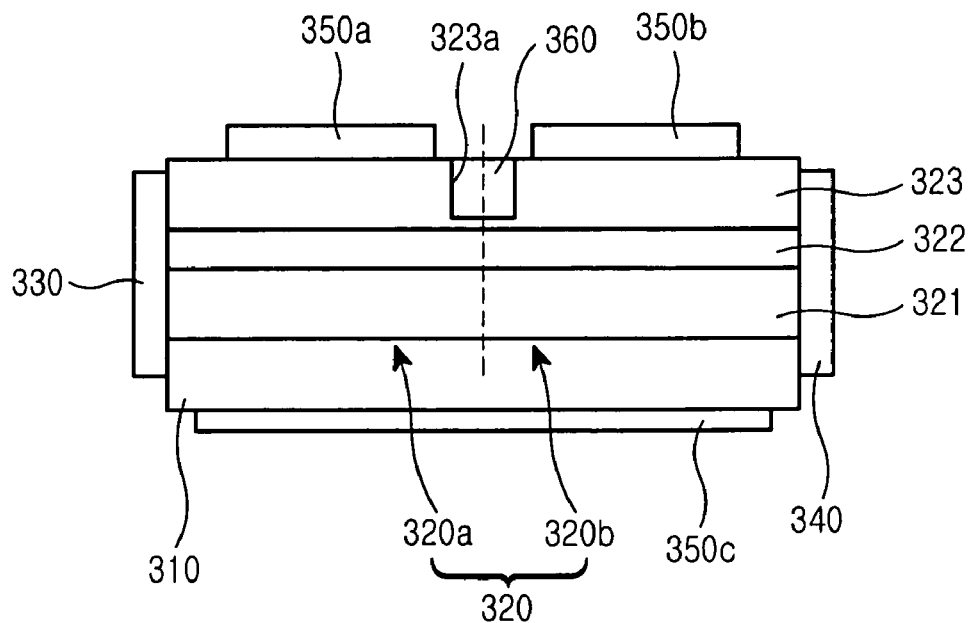
FIG. 3 is a diagram showing the construction of an optical transmitter module according to a third embodiment of the present invention.

FIG. 3 is a diagram showing the construction of an optical transmitter module according to a third embodiment of the present invention. As shown, the optical transmitter module according to the present invention includes: a substrate 310; a multi-layer crystal growth layer 320 divided into a first area 320*a* and a second area 320*b*; an electrode unit 350*a*, 350*b*, and 350*c*; an anti-reflection layer 330; a reflection layer 340; and an intermediate layer 360.

The intermediate layer 360 is formed between the first and second area 320*a* and 320*b*. The intermediate layer 360 increases insulation resistance of the optical transmitter module so that electric crosstalk between the first and second areas 320*a* and 320*b* is decreased. Also, the intermediate layer 360 induces change of a refractive index between the first and second areas 320*a* and 320*b*. As a result, the intermediate layer 360 forms a resonator structure having the second area 320*b* as a gain medium along with the reflection layer 340.

The intermediate layer 360 is formed by injecting a nonconductive medium formed by means of a diffusion process between the first and second areas 320*a* and 320*b* or by injecting a proton material between the first and second areas 320*a* and 320*b*.

The multi-layer crystal growth layer 320 comprises: a lower clad 321 formed on the substrate 310; an active layer 322 formed on the lower clad 321; and an upper clad 323 formed on the active layer 322. The multi-layer crystal growth layer 320 is divided into the first area 320*a* and the second area 320*b*.

The first area 320*a* amplifies an incoherent light inputted thereinto and outputs the amplified incoherent light to the second area 320*b*. The first area 220*a* also amplifies an optical signal inputted from the second area 320*b* and outputs the amplified optical signal to the anti-reflection layer 330.

The second area 320*b* creates an injection-locked optical signal with the incoherent light. The second area 320*b* is disposed between the intermediate layer 360 and the reflection layer 340, which are spaced apart from each other by a prescribed distance. Consequently, the second area 320*b* has the same operational characteristics as a Fabry-Perot laser for creating an injection-locked optical light with the incoherent light inputted from the first area 320*a*. The injection-locked optical signal with the incoherent output to the first area 320*a*.

The anti-reflection layer 330 is coated at one end of the optical module including the first area 320*a*. The reflection layer 340 is coated at the other end of the optical module including the second area 320*b*.

The electrode unit 350*a*, 350*b*, and 350*c* serves to independently inject currents into the first and second areas 320*a* and 320*b*. A common electrode 350*c* is formed on the lower surface of the substrate 310, and first and second electrodes 350*a* and 350*b* are formed on the upper surface of the multi-layer crystal growth layer 320 corresponding to the first and second areas 320*a* and 320*b* while being spaced apart from each other by a prescribed distance.

Figure 4:
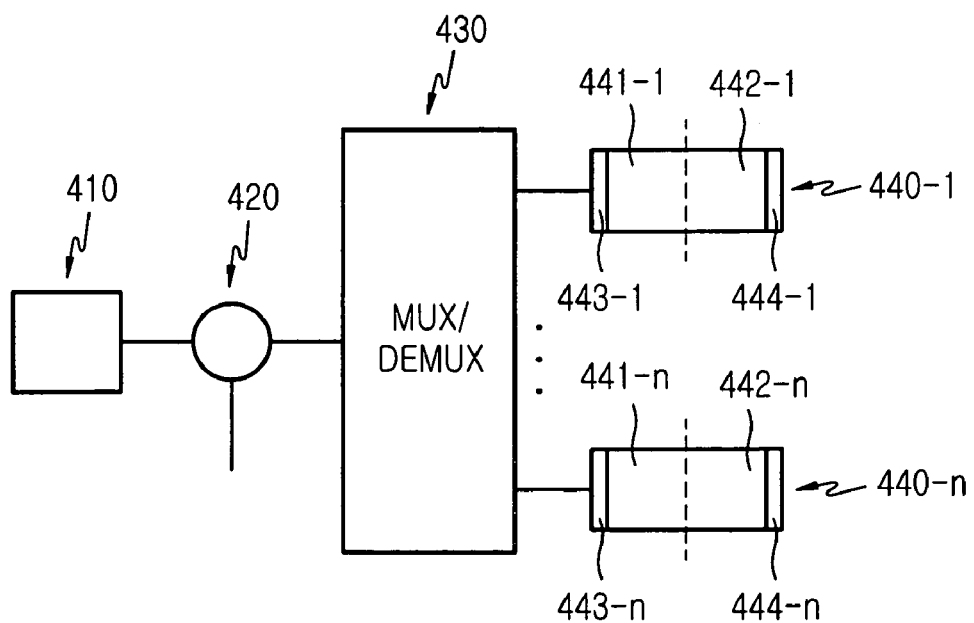
FIG. 4 is a diagram showing the construction of a wavelength division multiplexing light source employing the inventive module according to the present invention.

FIG. 4 is a diagram showing the construction of a wavelength division multiplexing light source employing inventive module including amplifying and modulating sections according to the present invention.

Note that a wavelength division multiplexing optical communication system typically includes: a plurality of subscribers, to whom communication services are provided; a central office for providing communication services with the respective subscribers; and remote nodes disposed between the central office and the respective subscribers for connecting the central office and the respective subscribers.

The central office includes a light source for creating downstream optical signals having different wavelengths, which are provided to the respective subscribers. The central office multiplexes the downstream optical signals created at the light source and outputs the multiplexed optical signals to the remote nodes.

The remote nodes are connected to the central office by means of a single optical fiber. The remote nodes multiplexes the demultiplexed downstream optical signals received from the central office on the respective wavelengths and then outputs the multiplexed optical signals to the corresponding subscribers.

The wavelength division multiplexing light source shown in FIG. 4 is applicable to a light source for creating the downstream optical signals of the central office. Referring to FIG. 4, the wavelength division multiplexing light source of the present invention comprises: a broadband light source 410; a circulator 420; a multiplexer/demultiplexer 430; and a plurality of optical modules 440-1 to 440-n for creating injection-locked optical signals.

The broadband light source 410 creates a broadband light and then outputs the broadband light to the circulator 420. The broadband light includes a plurality of incoherent lights having different wavelengths, and the incoherent lights are inputted to the corresponding optical modules 440-1 to 440-n.

The circulator 420 is disposed between the broadband light source 410 and the multiplexer/demultiplexer 430. The circulator 420 outputs the broadband light from the broadband light source 410 to the multiplexer/demultiplexer 430 and outputs the multiplexed optical signals from the multiplexer/demultiplexer 430 to another direction.

The multiplexer/demultiplexer 430 demultiplexes the broadband light inputted from the circulator 420 into incoherent lights having different wavelengths and outputs the demultiplexed incoherent lights to the respective optical modules 440-1 to 440-n. Also, the multiplexer/demultiplexer 430 multiplexes the optical signals generated by the optical modules 440-1 to 440-n and outputs them to the circulator 420.

One ends of the optical modules 440-1 to 440-n including first areas 441-1 to 441-n connected to the multiplexer/demultiplexer 430 are coated with anti-reflection layers 443-1 to 443-n, respectively, so that intensity loss is minimized when the incoherent lights and the optical signals are inputted/outputted.

On the other ends of the optical modules 440-1 to 440-n including second areas 442-1 to 442-n are coated with high-reflection layers 444-1 to 444-n, respectively, so that the optical signals created at the second areas 442-1 to 442-n are reflected.

The optical modules 440-1 to 440-n are divided into the first area 441-1 to 441-n for amplifying incoherent lights inputted thereinto, the second areas 442-1 to 442-n for creating optical signals with the incoherent light amplified at the first areas 441-1 to 441-n. The optical modules 440-1 to 440-n include the anti-reflection layers 443-1 to 443-n formed at one ends thereof, which are connected to the multiplexer/demultiplexer 430, and the high-reflection layers 444-1 to 444-n formed at the other ends thereof.

The first areas 441-1 to 441-n amplify the incoherent lights inputted from the multiplexer/demultiplexer 430 and then output the amplified incoherent lights to the second areas 442-1 to 442-n. Also, the first areas 441-1 to 441-n amplify injection-locked optical signals created at the second areas 442-1 to 442-n, and then output the amplified optical signals to the multiplexer/demultiplexer 430.

The second areas 442-1 to 442-n create optical signals with the incoherent lights inputted from the first areas 441-1 to 441-n, respectively. The created optical signals are reflected by means of the high-reflection layers 444-1 to 444-n, and are then outputted to the first areas 441-1 to 441-n, respectively. Thus, the second areas 442-1 to 442-n can be constructed as modulators for secondarily amplifying and modulating the incoherent lights amplified at the first areas 441-1 to 441-n.

Parts of the upper clads between the first areas 441-1 to 441-n and the second areas 442-1 to 442-n are formed with portions having altered refractive indexes so that the portions having the altered refractive indexes and the high-reflection layers 444-1 to 444-n together can perform the function of a resonator. In essence, the second areas 442-1 to 442-n have the same operational characteristics as a Fabry-Perot laser for creating injection-locked optical lights having the same wavelengths as the incoherent lights.

As apparent from the above description, the present invention provides an optical module wherein a semiconductor optical amplifier and a Fabry-Perot laser for creating an injection-locked optical light, or a reflective semiconductor optical amplifier for modulating a light signal, are integrated on a single substrate. Consequently, the present invention has an effect in that intensity of an incoherent light necessary for light amplification, which is required for injection locking and optical signal modulation, is decreased. Furthermore, the present invention has another effect of coupling an optical module and a broadband light source so that an economical wavelength division multiplexing light source can be realized.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A wavelength division multiplexing light source for optical networks, comprising:
    a broadband light source for creating a broadband light including a plurality of incoherent lights having different wavelengths;
    a plurality of optical modules each including a first area for amplifying the incoherent lights and optical signals and a second area for creating optical signals having the same wavelengths as the incoherent lights amplified by means of the first area wherein said second areas amplify and modulate the incoherent lights amplified at the first areas, respectively; and
    a multiplexer/demultiplexer disposed between the broadband light source and the optical modules for demultiplexing the broadband light into the incoherent lights so that the demultiplexed incoherent lights are outputted to the optical modules, respectively, and for multiplexing the plurality of optical signals having different wavelengths received from the optical modules so that the multiplexed optical signals are outputted.

2. The source as set forth in claim 1, wherein each of the optical modules further includes:
    an anti-reflection layer coated at one end thereof including the first area connected to the multiplexer/demultiplexer; and
    a high-reflection layer coated at the other end thereof including the second area.

3. The source as set forth in claim 1, further comprising:
    a circulator disposed between the broadband light source and the multiplexer/demultiplexer for outputting the broadband light to the multiplexer/demultiplexer and for outputting optical signals multiplexed by means of the multiplexer/demultiplexer to the outside.

4. The source as set forth in claim 1, wherein the second areas create injection-locked optical lights having the same wavelengths as the incoherent lights amplified by means of the first areas, respectively.

* * * * *